June 15, 1971 J. B. PREECE ET AL 3,585,089
METHOD OF MAKING FAST SWITCHING SEMICONDUCTIVE
DEVICES WITH SILICON NITRIDE PASSIVATION
Filed June 24, 1969 2 Sheets-Sheet 1

WITNESSES
H. M. Farkas
James F. Young

INVENTORS
JOHN B. PREECE &
WINAND J. DAUTZENBERG
BY Gordon W. Allen
ATTORNEY

United States Patent Office 3,585,089
Patented June 15, 1971

3,585,089

METHOD OF MAKING FAST SWITCHING SEMICONDUCTIVE DEVICES WITH SILICON NITRIDE PASSIVATION

John B. Preece, Hauppauge, N.Y., and Winand J. Dautzenberg, Laurel, Md., assignors to Westinghouse Electric Corporation, Pittsburgh, Pa.

Filed June 24, 1969, Ser. No. 835,963
Int. Cl. H01l 7/36
U.S. Cl. 148—187 5 Claims

ABSTRACT OF THE DISCLOSURE

Silicon nitride passivation, preferably with a sub-layer of silicon dioxide, is disclosed for fast switching (gold doped) semiconductor devices in a process wherein nitride deposition and pattern formation is completed prior to gold doping so the nitride layer is of good quality and readily etched.

BACKGROUND OF THE INVENTION

Field of the invention

This invention relates to the fabrication of semiconductor devices, including both discrete devices and integrated circuits. The invention particularly relates to the fabrication of fast switching silicon devices that have gold doping for fast switching and silicon nitride passivation for high reliability.

Description of the prior art

By way of background, reference is made to an article by Trapp and Preece entitled "Silicon Nitride Passivated Integrated Circuit-Reliability Improvements" that appeared in Proceedings of the 1967 Annual Symposium of Reliability Physics, November 1967. Technology is there described for the fabrication of semiconductor devices with passivation that includes a layer of silicon dioxide and a layer of silicon nitride. Reference is also made to copending application Ser. No. 752,849, filed Aug. 15, 1968, by Chu et al., and assigned to the assignee of the present invention, for further description of the formation and use of oxide-nitride layers.

It has been found that the addition of a silicon nitride layer overcomes the deficiencies of the single layer of silicon dioxide which has relatively high permeability to water vapor, positive ions and other contaminants as well as susceptibility to degradation by ionizing radiation. A single layer of silicon nitride, however, has been found to produce some charge instability in the semiconductor material under the voltage bias at room temperature as compared with devices with a single layer of silicon dioxide. Thus the art has recognized the advantages of employing both a layer of silicon dioxide adjacent semiconductor device surface and a subsequent layer of silicon nitride.

It has been known for some time to employ doping with a heavy metal such as gold to kill the lifetime of minority carriers in semiconductor devices, particularly silicon, thus making possible faster switching devices. This technique has been employed on silicon dioxide passivated devices. However, its application to devices with oxide-nitride passivation encounters additional difficulties. For high speed devices, such as TTL integrated circuits, the gold concentration is desirably close to the solubility limit.

After gold diffusion, any further high temperature processing causes aggregation of the gold, a reduction in recombination centers, and a corresponding deterioration in device switching characteristics. Optimum properties for silicon nitride are obtained by deposition of the nitride as the reaction product of the ammonolysis of silane or silicon tetrachloride. This deposition involves heating the device to a temperature usually within the range of from about 800° C. to 900° C. Such temperatures are sufficient to cause gold aggregation. It is also the case that the silicon nitride densifies at the gold diffusion temperature of about 1060° C. Such densification makes etching of the silicon nitride impossible. Thus the prior art has encountered difficulty in applying both oxide-nitride passivation and gold doping in a manner that does not unduly complicate and make expensive, the fabrication process.

SUMMARY OF THE INVENTION

The invention has among its objects to provide a fabrication process involving the use of oxide-nitride passivation and gold doping wherein gold aggregation is avoided and slicon nitride densification prior to etching contact windows is avoided.

The process, briefly, includes formation of the necessary semiconductive regions and PN junctions by techniques such as oxide masking and impurity diffusion with a resultant oxide layer covering the surface. A silicon nitride layer is deposited on the diffusion mask oxide. Contact windows are formed in the silicon nitride by first depositing a pyrolytic silicon dioxide layer thereon which is photolithographically processed to provide a mask for the etching of the silicon nitride windows. The silicon nitride windows are then etched prior to any gold diffusion or other operations that would densify the silicon nitride. Then gold diffusion is carried out such as by evaporating a layer of the metal on the back surface of the device and heating to diffuse it at a temperature of about 1060° C., during which the thermal oxide remains in place in the contact windows and the pyrolytic oxide remains over the silicon nitride. Following gold diffusion, the exposed oxide layers are removed by etching and the device is metallized to form necessary contacts and interconnections.

DESCRIPTION OF THE PREFERRED EMBODIMENTS

The description which follows is particularly directed to the practice of the method of the invention on a transistor structure of the type normally used in integrated circuits such as for high speed logic circuits. It is apparent that its application may be made to other semiconductor devices and integrated circuits.

Figure 1:
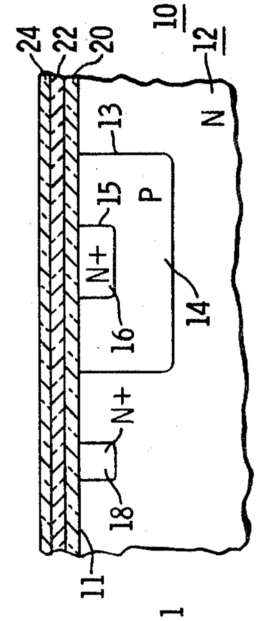

FIG. 1 shows a semiconductor body 10 such as one of silicon and has been processed through the formation of the various regions and PN junctions. The partial device shown includes regions of a bipolar transistor. These include an N type collector region 12 that is, usually, part of an epitaxial layer that has been formed on an underlying substrate (30 in FIG. 4) of opposite conductivity type. As is the case in usual commercial practice, the transistor is an NPN transistor. For high speed logic circuits to which the present invention is particularly relevant, the epitaxial layer for region 12, merely as an example, grown by thermal decomposition of silicon tetrachloride with hydrogen, with a doping impurity such as phosphorus introduced with the reactants, to form a layer having a thickness of about 10 microns and a resistivity of about 2 ohm centimeters.

Additional regions are then formed by impurity diffusion into surface 11 of the collector region 12. These include a transistor base region 14, an emitter region 16 and a collector contact region 18. Normally the transistor base region 14 is diffused through a first oxide mask with boron as an impurity. Typical depth and surface concentration of the base region 14 are about 2 microns and $1\times10^{19}$a./cc. The emitter and the collector contact region 16 and 18 are simultaneously diffused using a mask of silicon dioxide. Typically, they are diffused to a depth of about 1.5 microns and a surface concentration of about $5\times10^{20}$a./cc. The diffusion operations are carried out in a manner such that there results on the surface a layer of insulating material 20, the diffusion mask oxide, normally formed by thermal oxidation of the silicon. This layer may have steps (not shown) in it resulting from the successive masking and oxide reforming operations. Ordinarily, the first insulating layer should have a minimal thickness of about 1500 A. The operations indicated in the first boxes A and B of FIG. 7 have thus been completed.

Figure 7:
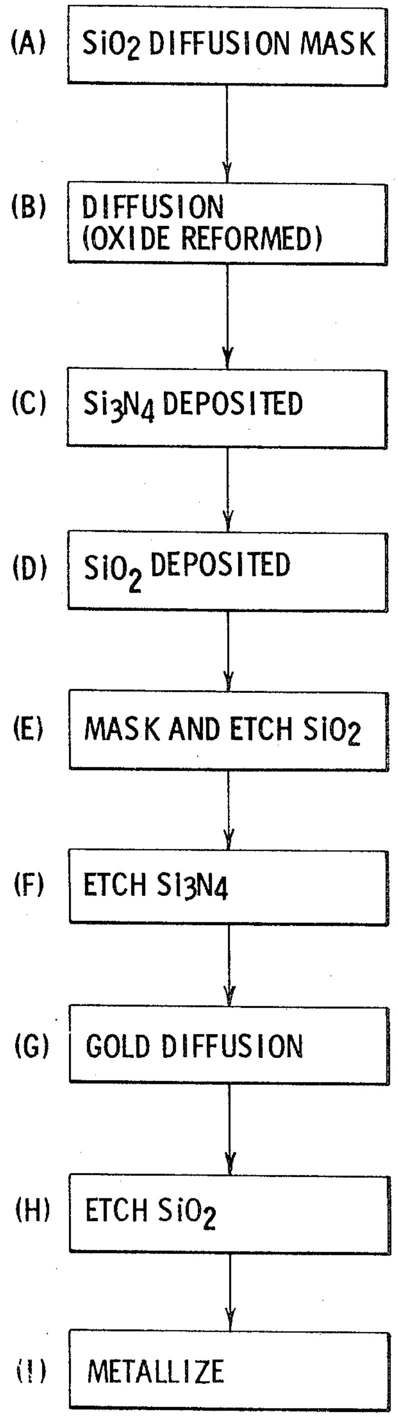
FIG. 7 is a block diagram further illustrating the sequence of steps in a method in accordance with this invention.

In the next step, box C of FIG. 7, a layer of silicon nitride 22 is deposited over the first insulating layer 20. This second layer 22 may be formed by the thermal reduction of silane, (or silicon tetrachloride) in ammonia at a temperature in the range of from about 800° C. to about 900° C. The silicon nitride is deposited as a continuous layer. It is thus required that openings be formed in it so that ohmic contacts can be made to the various underlying semiconductive regions without disturbing the portions of the first and second layers that overlie and protect the terminations of PN junctions 13 and 15 at the surface of the device.

A suitable thickness for the silicon nitride layer is in the range of from about 500 to about 2000 angstroms.

For the purpose of making the contact openings in the silicon nitride layer, a third insulating layer 24, which may be of silicon dioxide, is deposited by pyrolytic deposition onto the nitride surface (Box D of FIG. 7). The third layer 24, which may be formed by a thermal reduction of tetraethylorthosilicate, is deposited to a thickness within the range of from about 500 to about 1000 angstroms.

Figure 2:
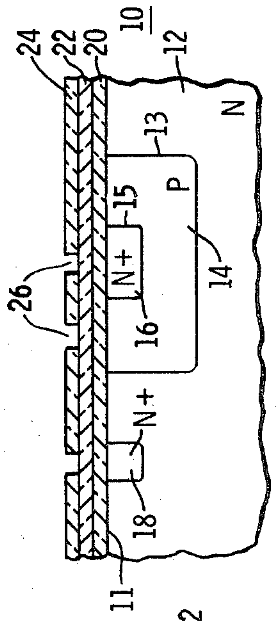

Proceeding to FIG. 2, and box E of FIG. 7, the third insulating layer 24 is masked and etched to form a pattern of openings 26 in the positions where ohmic contacts to the underlying semiconductor regions are desired. These include positions over the emitter, base and collector contact regions 16, 14 and 18. For this purpose, conventional photoresist technology with an etchant such as buffered hydrofluoric acid may be used. Such an etchant does not itself attack the silicon nitride.

Figure 3:
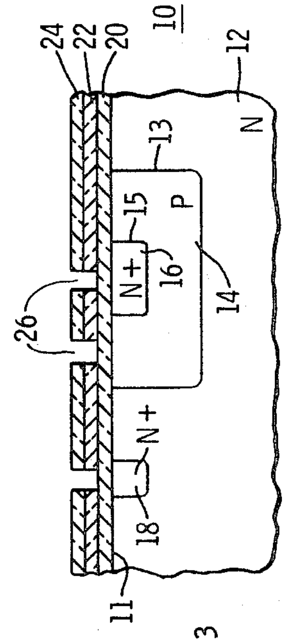

Proceeding to FIG. 3 and Box F of FIG. 7, the silicon nitride layer 22 is then etched using the patterned third insulating layer 24 as a mask to form essentially coincident openings therein. For the silicon nitride etching, hot phosphoric acid (at about 195° C. to 200° C.) may be used which does not substantially attack silicon dioxide.

The operations thus far described are completed prior to any gold diffusion because to diffuse gold densifies the silicon nitride and would make it difficult to etch particularly for openings about 0.5 mil or less as are desired for contact windows. On the other hand, to diffuse the gold prior to the nitride deposition would result in gold aggregation at the nitride deposition temperature.

Figure 4:
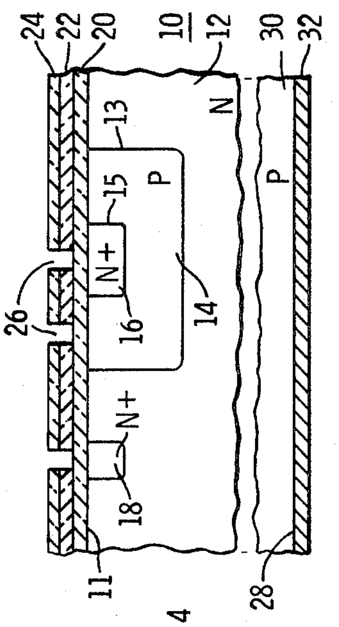
FIGS. 1 through 6 are partial sectional views of a semiconductor device at successive stages in a fabrication process in accordance with this invention.

Referring to FIG. 4 and Box G of FIG. 7, gold diffusion is carried out such as by deposition of a layer 32 of the metal on the reverse surface 28 of the device and heating to a temperature greater than 1000° C. (e.g., approximately 1060° C.) for a time of about 10 to 15 minutes in which the gold extends throughout the semiconductor body and effectively kills the minority carrier lifetime therein. Such a diffusion time is not sufficient to cause appreciable gold aggregation. Any excess gold remaining on the lower surface may be removed if desired. The gold diffusion at this stage is not harmful to the silicon nitride. The temperature employed resulting in densification of the nitride is believed in fact to improve the nitride qualities. Furthermore, during the gold diffusion, the silicon nitride is essentially protected by silicon dioxide. While gold is referred to as the dopant to reduce carrier lifetime, other heavy metals such as nickel and copper may also be used.

Figure 5:
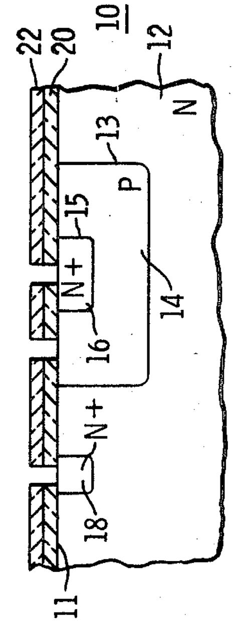

Referring to FIG. 5, and Box H of FIG. 7, the third insulating layer 24 and the exposed portions of the first insulating layer 20 are removed by an etchant which in the case of silicon dioxide may be buffered hydrofluoric acid.

Figure 6:
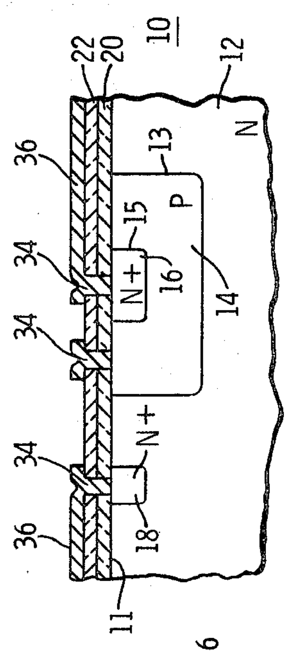

Referring to FIG. 6 and Box I of FIG. 7, the structure is metallized such as by evaporation onto the entire upper surface of the layer of aluminum with pattern delineation by photolithographic techniques to form desired ohmic contacts 34 and any conductive interconnections 36 which extends over the insulating layer surface.

It is therefore seen that, in accordance with this invention, it is possible to fabricate high speed digital integrated circuits and other fast switching semiconductor devices using silicon nitride passivation while avoiding the complications and disadvantages of the dissimilar thermal properties of the silicon nitride and gold used to kill carrier lifetime. Thus, there result fast switching devices with improved device reliability.

While the invention has been shown and described in a few forms only, it will be apparent that various other modifications may be made.

We claim:

1. In a method of semiconductor device fabrication, the steps comprising: forming a first semiconductive region of a first conductivity type in a second semiconductive region of a second conductivity type with a PN junction between said regions extending to a surface of said device; forming, prior, during or after the formation of said junction, a first insulating layer on said surface; depositing a second layer of silicon nitride on said first insulating layer wherein said device is heated to a first temperature; forming a pattern of openings at least through said second layer in positions over said first and second regions, said junction remaining covered at said surface; introducing a heavy metal carrier lifetime killer into said device, after formation of said openings in said second layer, wherein said device is heated to a second temperature higher than said first temperature; said first temperature being higher than the temperature at which said heavy metal aggregates.

2. The subject matter of claim 1 wherein: said first temperature is in the range of from about 800° C. to about 900° C. and said second temperature is greater than 1000° C.

3. The subject matter of claim 1 wherein: said second region is of impurity doped silicon; said first region is formed by introducing opposite type impurities in a portion of said second region through a mask of silicon dioxide which is then reformed to constitute said first insulating layer; said second layer of silicon nitride being formed by deposition from a vapor reaction; said heavy metal carrier lifetime killer is gold introduced by evaporating a layer of gold onto a second surface of said device and heating to diffuse said gold therein.

4. The subject matter of claim 3 wherein: the openings in said second layer of silicon nitride are formed by depositing on said second layer a third layer of silicon dioxide, masking and etching said pattern through said third layer using a first etchant whereby said third layer then provides a mask for said second layer; etching said pattern through said second layer using a second etchant.

5. The subject matter of claim 4 wherein: after said etching through said second layer, said third layer and portions of said first layer exposed through said openings in said second layer are removed and metal is applied through said openings to make ohmic contact to said first and second regions.

References Cited

UNITED STATES PATENTS

| | | | |
|---|---|---|---|
| 3,423,647 | 1/1969 | Kurosawa et al. | 148—187 |
| 3,472,689 | 10/1969 | Scott, Jr. | 148—187 |
| 3,479,237 | 11/1969 | Bergh et al. | 148—187 |

L. DEWAYNE RUTLEDGE, Primary Examiner

R. A. LESTER, Assistant Examiner

U.S. Cl. X.R.

29—578; 148—188